(12) United States Patent
Sohn

(10) Patent No.: US 10,026,357 B2
(45) Date of Patent: Jul. 17, 2018

(54) FLEXIBLE ORGANIC LIGHT EMITTING DISPLAY DEVICE

(71) Applicant: LG Display Co., Ltd., Seoul (KR)

(72) Inventor: MinHo Sohn, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/264,306

(22) Filed: Sep. 13, 2016

(65) Prior Publication Data

US 2017/0316738 A1 Nov. 2, 2017

(30) Foreign Application Priority Data

Apr. 29, 2016 (KR) .................. 10-2016-0053378

(51) Int. Cl.
*G09G 3/3225* (2016.01)
*G06F 1/16* (2006.01)
(Continued)

(52) U.S. Cl.
CPC ......... *G09G 3/3225* (2013.01); *G06F 1/1652* (2013.01); *G09G 3/3233* (2013.01);
(Continued)

(58) Field of Classification Search
None
See application file for complete search history.

(56) References Cited

U.S. PATENT DOCUMENTS 9,287,329 B1 * 3/2016 Lee ................ H01L 51/0097
2007/0018170 A1 1/2007 Jeong et al.
(Continued)

FOREIGN PATENT DOCUMENTS

JP 45-19948 A 7/1970
JP 2007-25620 A 2/2007
(Continued)

OTHER PUBLICATIONS

Kuo et al., "Electrical Characteristics and Mechanical Limitation of Polycrystalline Silicon Thin Film Transistor on Steel Foil Under Strain," ISDRS 2009, College Park, MD, USA, Dec. 9-11, 2009, 2 pages.
(Continued)

*Primary Examiner* — Gustavo Polo
(74) *Attorney, Agent, or Firm* — Birch, Stewart, Kolasch & Birch, LLP

(57) ABSTRACT

Discussed is a flexible organic light emitting display device. The flexible organic light emitting display device according to an embodiment includes a panel, a data driver configured to drive data lines included in the panel, a gate driver configured to drive gate lines included in the panel, a sensing unit, and a controller. The sensing unit may sense bending of the panel in a blank period of one frame period by using a pixel driving circuit included in each of a plurality of pixels included in the panel, for sensing a characteristic change of a driving transistor driving an organic light emitting diode included in each of the plurality of pixels, the one frame period including the blank period and a display period. The controller may sense the characteristic change of the driving transistor or analyze whether the panel is bent, based on pieces of sensing data transferred from the sensing unit.

12 Claims, 10 Drawing Sheets

(51) Int. Cl.
*G09G 3/3266* (2016.01)
*G09G 3/3275* (2016.01)
*G09G 3/3233* (2016.01)

(52) U.S. Cl.
CPC ......... *G09G 3/3266* (2013.01); *G09G 3/3275* (2013.01); *G09G 2300/0842* (2013.01); *G09G 2310/061* (2013.01); *G09G 2320/029* (2013.01); *G09G 2380/02* (2013.01); *H01L 2251/5338* (2013.01)

(56) References Cited

U.S. PATENT DOCUMENTS

| | | |
|---|---|---|
| 2007/0229417 A1 | 10/2007 | Giraldo et al. |
| 2009/0066345 A1 | 3/2009 | Klauk et al. |
| 2013/0147694 A1 | 6/2013 | Kim et al. |
| 2014/0028597 A1 | 1/2014 | Cho et al. |
| 2014/0096616 A1 | 4/2014 | Jeon et al. |
| 2014/0152633 A1 | 6/2014 | Park et al. |
| 2014/0204509 A1 | 7/2014 | Park |
| 2014/0306985 A1 | 10/2014 | Jeong et al. |
| 2014/0354617 A1 | 12/2014 | Nam et al. |
| 2015/0022445 A1 | 1/2015 | Moriwaki |
| 2015/0154908 A1 | 6/2015 | Nam et al. |
| 2015/0154913 A1 | 6/2015 | Kim |
| 2015/0301636 A1 | 10/2015 | Akimoto et al. |
| 2015/0316958 A1 | 11/2015 | Takesue |

FOREIGN PATENT DOCUMENTS

| | | |
|---|---|---|
| JP | 2007-530957 A | 11/2007 |
| JP | 2007-537476 A | 12/2007 |
| JP | 2012-198541 A | 10/2012 |
| JP | 2014-109778 A | 6/2014 |
| JP | 2015-228020 A | 12/2015 |
| KP | 10-2013-0066449 A | 6/2013 |
| KP | 10-2015-0064460 A | 6/2015 |
| KP | 10-2015-0065026 A | 6/2015 |
| TW | 201523564 A | 6/2015 |

OTHER PUBLICATIONS

Ma et al., "Flexible TFT Circuit Analyzer Considering Process Variation, Aging, and Bending Effects," Journal of Display Technology, vol. 10, No. 1, Jan. 2014 (Dec. 27, 2013; first published Aug. 15, 2013), pp. 19-26.

Servati et al., "Functional Pixel Circuits for Elastic AMOLED Displays," Proceedings of the IEEE, vol. 93, No. 7, Jul. 2005, pp. 1257-1264.

* cited by examiner

FLEXIBLE ORGANIC LIGHT EMITTING DISPLAY DEVICE

CROSS-REFERENCE TO THE RELATED APPLICATIONS

This application claims the priority benefit of the Korean Patent Application No. 10-2016-0053378 filed on Apr. 29, 2016, which is hereby incorporated by reference as if fully set forth herein.

BACKGROUND OF THE INVENTION

Field of the Invention

The present invention relates to an organic light emitting display device, and more particularly, to a flexible organic light emitting display device.

Discussion of the Related Art

Examples of display devices include liquid crystal display (LCD) devices, organic light emitting display devices, electrophoretic display devices, etc.

In the related art, a glass substrate is used in order for organic light emitting display devices to endure heat occurring in a manufacturing process. For this reason, there is a limitation in making the organic light emitting display devices of the related art light, thin, or flexible.

Recently, flexible organic light emitting display devices which maintain display performance as-is despite being bent like paper are manufactured by using flexible materials which are folded or unfolded like plastic films, instead of glass substrates which have no flexibility. The flexible organic light emitting display devices may be folded by half or wound, and a portion of a corner of each of the flexible organic light emitting display devices may be folded.

In the flexible organic light emitting display devices, various interfaces are implemented for checking whether the flexible organic light emitting display devices are bent. Typically, a bending sensor may be mounted in a non-display area of each of the flexible organic light emitting display devices, for checking a degree to which the flexible organic light emitting display devices are bent.

FIG. 1 is a diagram illustrating a related art flexible organic light emitting display device 10 equipped with a bending sensor. The related art flexible organic light emitting display device 10, as illustrated in FIG. 1, includes a display area 1 displaying an image and a non-display area 2 which is disposed outside the display area 1 and cannot display an image. A bending sensor 3 for determining whether the flexible organic light emitting display device 10 is bent is disposed in the non-display area 2. In the related art flexible organic light emitting display device 10, since the bending sensor 3 is additionally provided, the manufacturing cost increases, and a manufacturing process becomes complicated.

Further, a plurality of the bending sensors 3 should be provided in in order to accurately sense deformation of a whole area of the flexible organic light emitting display device 10. However, since the plurality of bending sensors 3 should be disposed in the non-display area 2, it is difficult to manufacture a narrow bezel display device including a non-display area having a small width. Moreover, a separate bending sensor 3 should be additionally provided even in the display area 1, for sensing bending of the display area 1.

SUMMARY OF THE INVENTION

Accordingly, the present invention is directed to providing a flexible organic light emitting display device that addresses the above-noted and other problems due to limitations and disadvantages of the related art.

An aspect of the present invention is directed to providing a flexible organic light emitting display device which determines whether a panel is bent, by using a pixel driving circuit having a function of sensing a characteristic change of a driving transistor driving an organic light emitting diode.

According to the embodiments of the present invention, a bending sensor for determining whether the panel is bent or a degree to which the panel is bent is not needed. Therefore, the manufacturing cost of the flexible organic light emitting display device is reduced, and a manufacturing process is simplified. According to the embodiments of the present invention, although a separate bending sensor is not provided, whether the panel is bent is accurately determined. Moreover, according to the embodiments of the present invention, since a deformation degree of the flexible organic light emitting display device is sensed in real time, various applications associated with the presence of bending are simply executed.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided a flexible organic light emitting display device that includes a panel, a data driver configured to drive a plurality of data lines included in the panel, a gate driver configured to drive a plurality of gate lines included in the panel, a sensing unit, and a controller. The sensing unit may sense bending of the panel in a blank period of one frame period by using a pixel driving circuit included in each of a plurality of pixels included in the panel, for sensing a characteristic change of a driving transistor driving an organic light emitting diode included in each of the plurality of pixels, the one frame period including the blank period and a display period. The controller may sense the characteristic change of the driving transistor or analyze whether the panel is bent, based on pieces of sensing data transferred from the sensing unit.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE EMBODIMENTS

Figure 1:
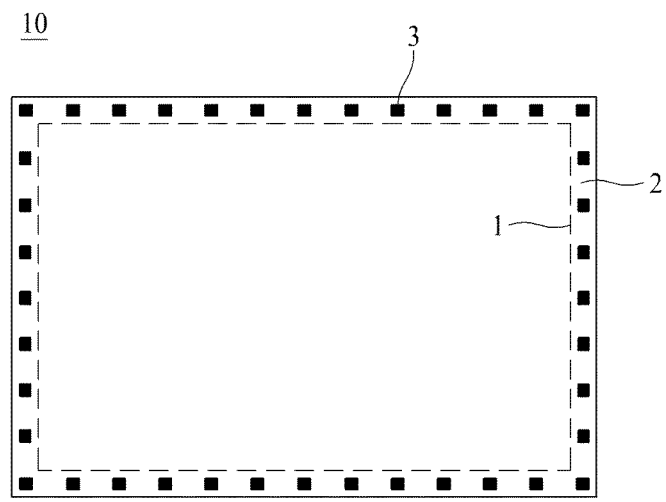
FIG. 1 is a diagram illustrating a related art flexible organic light emitting display device equipped with a bending sensor.

Reference will now be made in detail to the embodiments of the present invention, examples of which are illustrated in the accompanying drawings. Wherever possible, the same reference numbers will be used throughout the drawings to refer to the same or like parts.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Furthermore, the present invention is only defined by scopes of claims.

In the specification, in adding reference numerals for elements in each drawing, it should be noted that like reference numerals already used to denote like elements in other drawings are used for elements wherever possible.

A shape, a size, a ratio, an angle, and a number disclosed in the drawings for describing embodiments of the present invention are merely an example, and thus, the present invention is not limited to the illustrated details. In a case where 'comprise', 'have', and 'include' described in the present specification are used, another part may be added unless 'only' is used. The terms of a singular form may include plural forms unless referred to the contrary.

In construing an element, the element is construed as including a tolerance range although there is no explicit description. In describing a position relationship, for example, when a position relation between two parts is described as 'on', 'over', 'under', and 'next', one or more other parts may be disposed between the two parts unless 'just' or 'direct' is used. In describing a time relationship, for example, when the temporal order is described as 'after', 'subsequent', 'next', and 'before', a case which is not continuous may be included unless 'just' or 'direct' is used.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, embodiments of the present invention will be described in detail with reference to the accompanying drawings.

Figure 2:
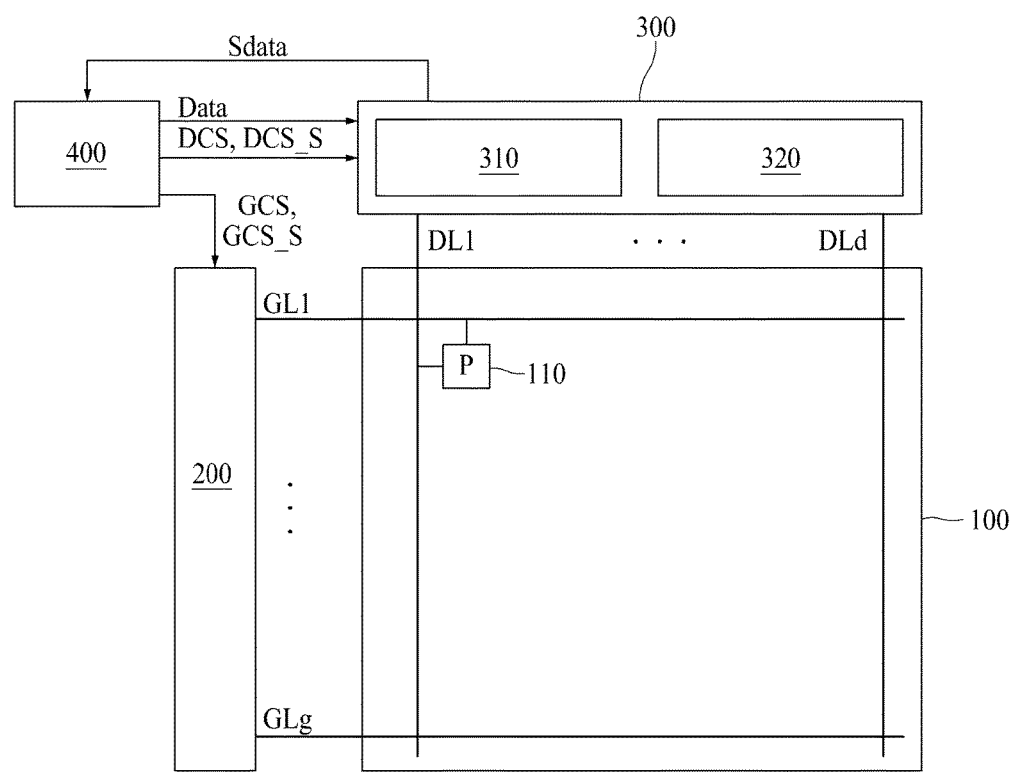
FIG. 2 is a diagram illustrating a flexible organic light emitting display device according to an embodiment of the present invention.
Figure 3:
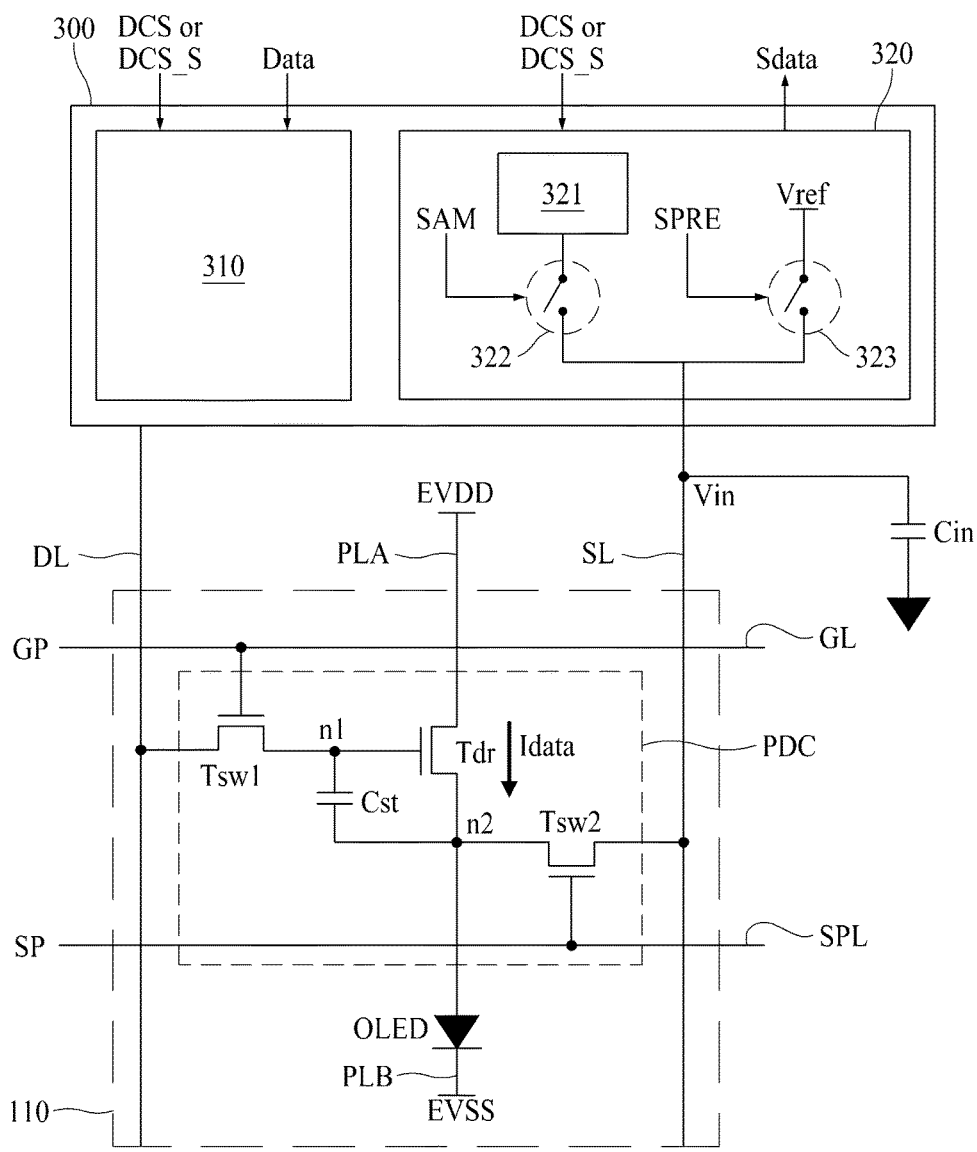
FIG. 3 is a diagram illustrating a structure of a pixel provided in a panel applied to a flexible organic light emitting display device according to an embodiment of the present invention.

FIG. 2 is a diagram illustrating a flexible organic light emitting display device according to an embodiment of the present invention. FIG. 3 is a diagram illustrating a structure of a pixel provided in a panel of the flexible organic light emitting display device according to an embodiment of the present invention.

The flexible organic light emitting display device according to an embodiment of the present invention, as illustrated in FIG. 2, may include a panel 100, a data driver 310 that drives a plurality of data lines DL1 to DLd included in the panel 100, a gate driver 200 that drives a plurality of gate lines GL1 to GLg included in the panel 100, a sensing unit 320 that senses bending of the panel 100 in a blank period of one frame period by using a pixel driving circuit which is included in each of a plurality of pixels 110 provided in the panel 100, for sensing a characteristic change of a driving transistor driving an organic light emitting diode OLED included in each of the pixels 110, and a controller 400 that determines a characteristic change of the driving transistor or analyzes whether the panel 100 is bent, based on sensing data transmitted from the sensing unit 320.

The sensing unit 320 may be provided in a driver 300 along with the data driver 310, or may be provided independently from the data driver 310. Hereinafter, a flexible organic light emitting display device where the sensing unit 320 and the data driver 310 are included in the driver 300 as illustrated in FIG. 2 will be described as an example of the present invention.

In the panel 100, as illustrated in FIG. 3, the pixels 110 and a plurality of pixel areas where the pixels 110 are provided may be defined, and a plurality of signal lines GL, DL, PLA, PLB, SL and SPL for respectively supplying a plurality of driving signals to a pixel driving circuit PDC included in each of the pixels 110 may be arranged. Each of the pixels 110 may include an organic light emitting diode OLED and the pixel driving circuit PDC. The pixel driving circuit PDC may include a driving transistor Tdr that controls a current flowing in the organic light emitting diode OLED.

The pixel driving circuit PDC may include a first switching transistor Tsw1, a second switching transistor Tsw2, a driving transistor Tdr, and a capacitor Cst. Here, the transistors Tsw1, Tsw2 and Tdr may each be a thin film transistor (TFT), and for example, may be an amorphous-silicon (a-Si) TFT, a poly-Si TFT, an oxide TFT, an organic TFT, or the like.

The first switching transistor Tsw1 may be turned on by a gate pulse GP and may supply a data voltage Vdata, supplied through a data line DL, to the driving transistor Tdr through a first node n1. The second switching transistor Tsw2 may be turned on by a sensing pulse SP and may supply a reference voltage Vref, supplied through a sensing line SL, to a second node n2 connected to the driving transistor Tdr. The second switching transistor Tsw2 may sense a characteristic of the driving transistor Tdr. Characteristics of the driving transistor Tdr may include, for example, mobility or a threshold voltage. The sensing unit 320 may convert a sensing signal sensed through the second switching transistor Tsw2 into sensing data Sdata that is a digital signal, and may transmit the sensing data Sdata to the controller 400. The controller 400 may determine the mobility or the threshold voltage by using the sensing data Sdata. The controller 400 may analyze the mobility or the threshold voltage to shift a level of a data voltage which is to be supplied to a corresponding pixel. Such an operation may be referred to as external compensation.

The driving transistor Tdr may be turned on by a voltage of the capacitor Cst and may control an amount of current flowing from a first driving power line PLA to the organic light emitting diode OLED. A first power EVDD may be supplied to the driving transistor Tdr through the first driving power line PLA.

The organic light emitting diode OLED may emit light upon being supplied with a data current Idata from the driving transistor Tdr, and may emit light having a luminance corresponding to the data current Idata. A second power EVSS may be connected to the organic light emitting diode OLED through a second driving power line PLB.

Hereinabove, an example of a structure of each of the pixels 110 for performing the external compensation has been described with reference to FIG. 3. However, each of the pixels 110 may be configured in various structures in addition to the structure illustrated in FIG. 3.

As described above, the external compensation may involve an example operation of calculating a variation rate of the threshold voltage or mobility of the driving transistor Tdr included in each of the pixels 110 to shift a level of a data voltage supplied to a pixel according to the variation rate. However, the structure of each of the pixels 110 may be modified into various forms so as to calculate the variation rate of the threshold voltage or mobility of the driving transistor Tdr. Moreover, the method of calculating the variation rate of the threshold voltage or mobility of the driving transistor Tdr by using the pixels 110 may be variously modified based on the structure of each of the pixels 110.

In other words, a structure of each pixel for the external compensation may be selected from among various structures of each pixel proposed for the external compensation, and a method of performing the external compensation may be selected from among various external compensation methods proposed for the external compensation. For example, a structure of each pixel for the external compensation and a method of performing the external compensation may respectively use a structure and a method disclosed in Korean Patent Publication No. 10-2013-0066449 and other published patents, and moreover, may respectively use a structure and a method disclosed in each of Korean Patent Application Nos. 10-2013-0150057 and 10-2013-0149213. That is, a detailed structure of each pixel for performing the external compensation and a detailed external compensation method may vary from the technical scope of the present invention. An example of an external compensation method will be described below. In addition, according to an embodiment of the present invention, operations performed using the pixel driving circuit PDC in the external compensation method may also be used to determine whether the panel 100 is bent or the degree to which the panel 100 is bent.

Figure 4:
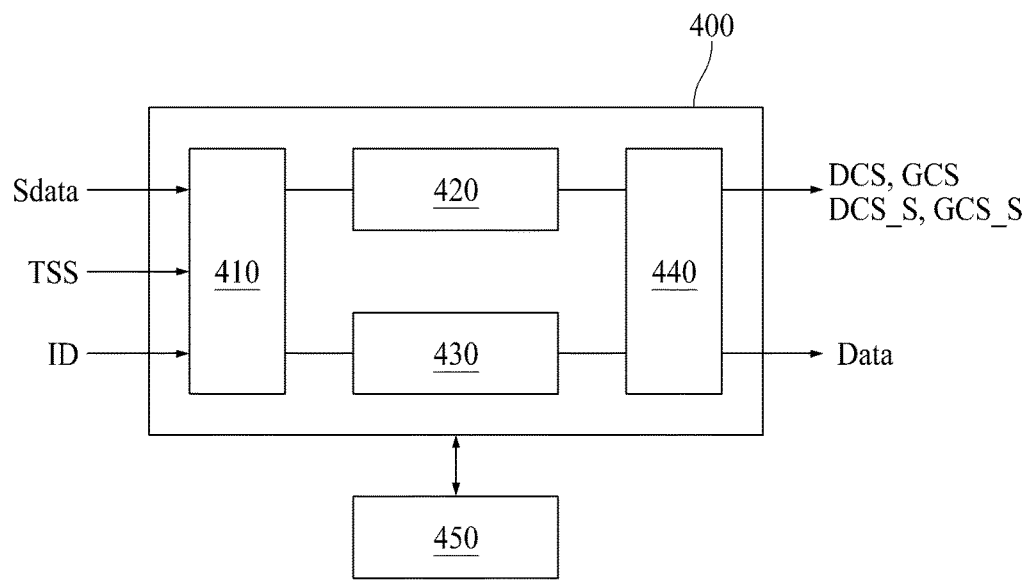
FIG. 4 is a diagram illustrating a configuration of a controller applied to a flexible organic light emitting display device according to an embodiment of the present invention.

FIG. 4 is a diagram illustrating a configuration of a controller applied to a flexible organic light emitting display device according to an embodiment of the present invention. In the following description, one frame period may include a display period where an image is displayed and a blank period where an image is not displayed. The sensing unit 320 may sense bending of the panel 100 in the blank period. The controller 400 may operate the panel 100 in a sensing mode or a display mode.

The sensing mode may be executed in the blank period (or a blank time). The sensing mode may denote a driving mode in a period where sensing is performed. In the sensing mode, sensing for correcting a characteristic change of the driving transistor Tdr may be performed, and a panel driver (e.g., the controller 400) may calculate an external compensation value, based on sensing data extracted through the sensing. The characteristic change of the driving transistor Tdr may include a change in mobility or a threshold voltage. Also, in the sensing mode, the panel driver (e.g., the controller 400) may determine whether the panel 100 is bent or determine a degree to which the panel 100 is bent.

Furthermore, during the sensing mode, in a main sensing period of the blank period, the sensing unit 320 may drive first pixel driving circuits included in pixels connected to a first gate line to perform a sensing operation of sensing the characteristic changes of driving transistors included in the first pixel driving circuits to calculate the external compensation value. In an auxiliary sensing period of the blank period, the sensing unit 320 may drive at least one second pixel driving circuit included in pixels connected to a second gate line disposed in a bending area to determine whether the bending area is bent.

The display mode may denote a driving mode in a period where the sensing operation is not performed. In the display mode, the panel 100 may display an image. In the display mode, input image data may be converted into external compensation image data by using the external compensation value, and an external compensation data voltage corresponding to the external compensation image data may be supplied to the panel 100 through a corresponding data line.

In order to perform the above-described function, as described with respect to FIG. 4, the controller 400 may include: a calculator 410 that determines the characteristic change of each of the pixels by using the sensing data Sdata transferred from the sensing unit 320 to calculate the external compensation value in the main sensing period, and in the auxiliary sensing period, determines whether the panel 100 is bent, based on the sensing data transferred from the sensing unit 320; a data aligner 430 that aligns input image data ID received through the calculator 410 from an external system according to a structure of the panel 100, based on the external compensation value; a control signal generator 420 that generates data control signals DCS and DCS_S for controlling the data driver 310 and gate control signals GCS and GCS_S for controlling the gate driver 200, based on a timing synchronization signal TSS transferred from the external system; and an output unit 440 that transfers image data Data, the data control signals DCS and DCS_S, and the gate control signals GCS and GCS_S, which are transferred from the data aligner 430, to the data driver 310 and the gate driver 200.

Bending information about the bending of the panel 100 calculated by the calculator 410 may be transferred to the external system. The external system may execute various applications, based on the bending information. The various applications may include a function of powering off the flexible organic light emitting display device and a function of controlling an image displayed by the panel 100.

The flexible organic light emitting display device according to an embodiment of the present invention may further include a storage unit 450 for storing various information about the external compensation. The storage unit 450 may be included in the controller 400, or may be provided independently from the controller 400. The storage unit 450 may store various information which is be used to determine whether the panel 100 is bent or a degree to which the panel 100 is bent.

Figure 5:
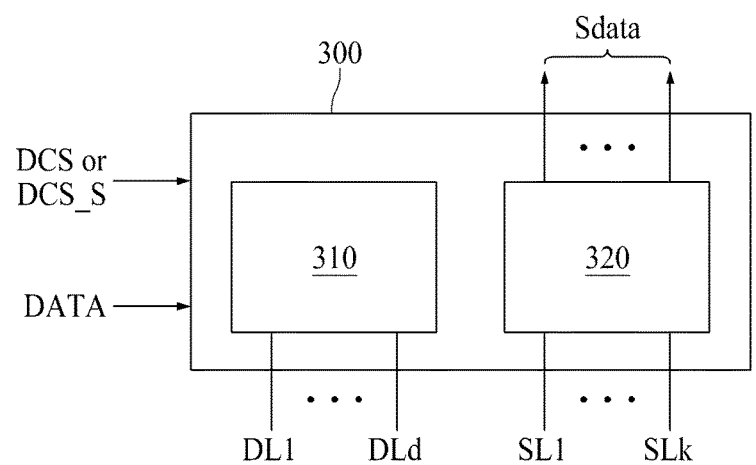
FIG. 5 is a diagram illustrating a configuration of a driver applied to a flexible organic light emitting display device according to an embodiment of the present invention.

FIG. 5 is a diagram illustrating a configuration of the driver 300 applied to the flexible organic light emitting display device according to an embodiment of the present invention. As described above, the driver 300 may include the data driver 310 and the sensing unit 320.

First, the data driver 310 may be connected to the data lines DL1 to DLd. In the display period, the data driver 310 may convert the image data Data, in which the external compensation value is reflected, into a data voltage and may output the data voltage to a corresponding data line. In the display period, the data driver 310 may simultaneously output data voltages corresponding to one horizontal line to the normal data lines DL1 to DLd according to a normal data control signal DCS among the data control signals. In the main sensing period, the data driver 310 may output data voltages, used to sense mobility or a threshold voltage, to the data lines DL1 to DLd according to the data control signal DCS. In the auxiliary sensing period, the data driver 310 may output data voltages, used to determine whether the panel 100 is bent, to the data lines DL1 to DLd according to a sensing data control signal DCS_S among the data control signals.

Second, in the main sensing period and the auxiliary sensing period, the sensing unit 320 may convert an analog signal, received from the pixel driving circuit PDC, into sensing data Sdata that is a digital signal and may transfer the sensing data Sdata to the controller 400. In the main sensing period, the sensing unit 320 may be driven according to the normal data control signal DCS and may transfer pieces of sensing data, collected through a plurality of sensing lines SL1 to SLk, to the controller 400. In the auxiliary sensing period, the sensing unit 320 may be driven according to the sensing data control signal DCS_S and may transfer pieces of sensing data, collected through the sensing lines SL1 to SLk, to the controller 400. The normal data control signal DCS and the sensing data control signal DCS_S may be the same or may differ.

Figure 6:
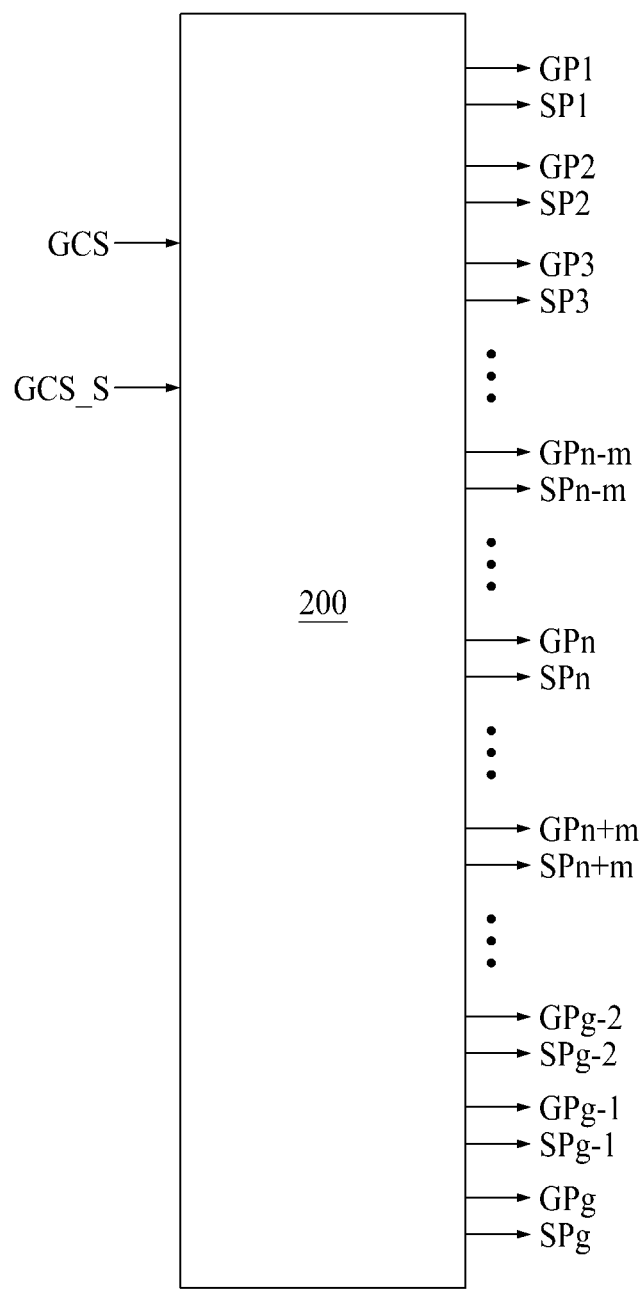
FIG. 6 is a diagram illustrating a configuration of a gate driver applied to a flexible organic light emitting display device according to an embodiment of the present invention.

FIG. 6 is a diagram illustrating a configuration of the gate driver 200 applied to the flexible organic light emitting display device according to an embodiment of the present invention.

In the display period, the gate driver 200 may sequentially generate a gate pulse GP and may sequentially supply the gate pulse GP to the gate lines GL1 to GLg according to a normal gate control signal GCS among the gate control signals GCS and GCS_S supplied from the controller 400. During a period where the gate pulse GP is not output to a corresponding gate line, a turn-off signal for turning off the first switching transistor Tsw1 connected to the corresponding gate line may be output to the corresponding gate line. A gate signal GS may be a generic name for the gate pulse and the turn-off signal.

In the main sensing period, the gate driver 200 may generate the gate pulse GP and a sensing pulse SP according to the normal gate control signal GCS supplied from the controller 400 and may supply the gate pulse GP and the sensing pulse SP to a gate line from which mobility or a threshold voltage is sensed.

In the auxiliary sensing period, the gate driver 200 may generate the gate pulse GP and the sensing pulse SP according to a sensing gate control signal GCS_S among the gate control signals GCS and GCS_S supplied from the controller 400 and may supply the gate pulse GP to a gate line and the sensing pulse SP to a sensing pulse line disposed in the bending area. In the auxiliary sensing period, the gate driver 200 may sequentially drive two or more gate lines disposed in the bending area. In this case, the sensing unit 320 may sequentially drive the pixel driving circuits, connected to the two or more gate lines which are sequentially driven, to sense bending information about the bending area.

Further, the controller 400 may generate the normal gate control signal GCS to transfer the normal gate control signal GCS to the gate driver 200 in the display period, and in the auxiliary sensing period, the controller 400 may generate the sensing gate control signal GCS_S to transfer the sensing gate control signal GCS_S to the gate driver 200. In this case, the gate driver 200 may output gate pulses, having a frequency higher than frequencies of gate pulses which are output to the gate lines in the display period, to the gate lines.

The normal gate control signal GCS and the sensing gate control signal GCS_S may be the same or may differ. The normal gate control signal GCS and the sensing gate control signal GCS_S may each include a gate shift clock, a gate start signal, a gate clock, a gate output enable signal, and other signals associated with control of a gate.

The gate driver 200 may be directly provided in the panel 100 in a process of forming a TFT of each of the pixels 100 or may be equipped as an integrated circuit (IC) type in the panel 100. A type where the gate driver 200 is directly provided in the panel 100 may be referred to as a gate-in panel (GIP) type. The GIP type gate driver 200 may include a plurality of stages (Stage 1 to Stage g). The stages may sequentially output gate pulses GP1 to GPg, respectively. Also, the stages may sequentially output sensing pulses SP1 to SPg, respectively.

A gate pulse output from a front end stage may allow a rear end stage to be driven. In this case, at least one other stage may be provided between the front end stage and the rear end stage.

Figure 7:
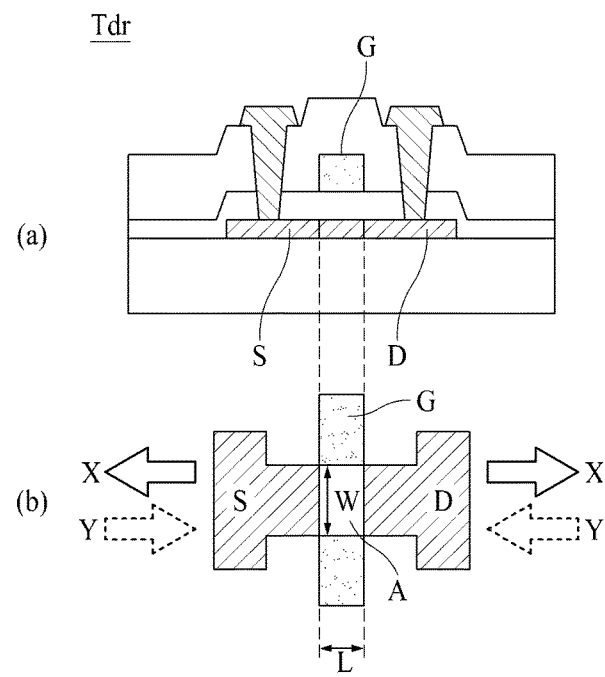
FIG. 7 is a diagram illustrating a configuration of a driving transistor applied to a flexible organic light emitting display device according to an embodiment of the present invention.

FIG. 7 is a diagram illustrating a configuration of a driving transistor Tdr applied to the flexible organic light emitting display device according to an embodiment of the present invention. (a) in FIG. 7 illustrates a cross-sectional surface of the driving transistor Tdr, and (b) in FIG. 7 illustrates a plane of the driving transistor Tdr.

When the flexible organic light emitting display device is physically deformed due to an external force or an internal factor, the driving transistor Tdr included in each pixel may also extend or shrink. For this reason, a value of a data current Idata flowing to the organic light emitting diode OLED may vary.

A relationship between data current flowing to the OLED and the driving transistor is described, for example, in "Electrical characteristics and mechanical limitation of polycrystalline silicon thin film transistor on steel foil under strain, ISDRS 2009, Dec. 9-11, College Park, Md., USA".

According to an embodiment of the present invention, a determination of whether the bending area including the driving transistor Tdr extends or shrinks may be performed by analyzing a level of the data current Idata flowing in the driving transistor Tdr. For example, as illustrated in (a) in FIG. 7 and (b) in FIG. 7, if the driving transistor Tdr includes a gate G, a source S, and a drain D, the driving transistor Tdr may extend in an X direction or may shrink in a Y direction, or when tilting occurs, a width W and a length L of an active area (a channel) A of the driving transistor Tdr may vary.

The controller 400 may analyze the sensing data transferred from the sensing unit 320 to determine a variation rate of the width W or the length L and may determine whether the bending area where the driving transistor Tdr is provided is bent or a degree to which the bending area is bent, based on a result of the determination. For example, the data current Idata which flows to the organic light emitting diode OLED through the driving transistor Tdr may be expressed as the following Equation (1):

$$I_{DATA}(\mu C_i/2)(W/L)(V_{GS}-V_T)^2 \qquad (1)$$

where μ denote a mobility of the driving transistor Tdr, Ci denotes a gate oxide capacitance of the driving transistor Tdr, W denotes a width of the driving transistor Tdr, L denotes a length of the driving transistor Tdr, $V_{GS}$ denotes a difference voltage (a gate-source voltage) between a gate and a source of the driving transistor Tdr, and $V_T$ denotes a threshold voltage of the driving transistor Tdr.

In this case, when the driving transistor Tdr extends, the data current Idata may increase, and thus, a capacitance Cin of a capacitor connected to a sensing line SL illustrated in FIG. 3 may increase, whereby a voltage or a current applied to the sensing unit 320 may increase. The sensing unit 320 may convert the sensed voltage or current into the sensing data that is a digital value, and may transfer the sensing data to the controller 400.

On the other hand, when the driving transistor Tdr shrinks, the data current Idata may decrease, and thus, the capacitance Cin of the capacitor connected to the sensing line SL illustrated in FIG. 3 may decrease, whereby the voltage or the current applied to the sensing unit 320 may decrease. The sensing unit 320 may convert the sensed voltage or current into the sensing data that is a digital value, and may transfer the sensing data to the controller 400. Such operations may be repeated in each frame or in a predetermined frame.

The controller 400 may analyze the sensing data in each frame or in the predetermined frame to determine whether the voltage or the current increases or decreases, and thus may determine whether an area where the driving transistor Tdr is provided extends, shrinks, or tilts. Provided the results of the analysis, the controller 400 may determine whether the bending area where the driving transistor Tdr is provided is bent or a degree to which the bending area is bent.

Figure 10:
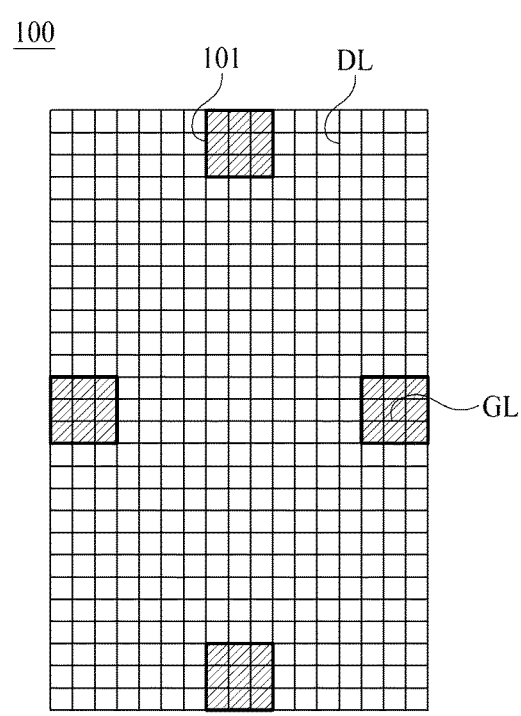
Figure 11:
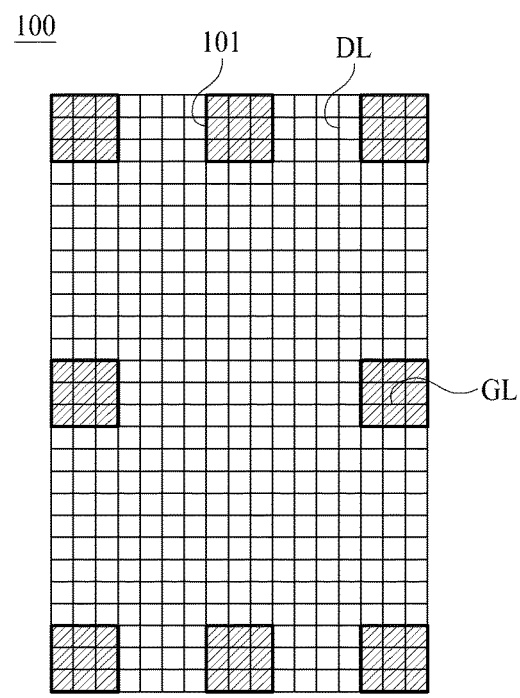
Figure 12:
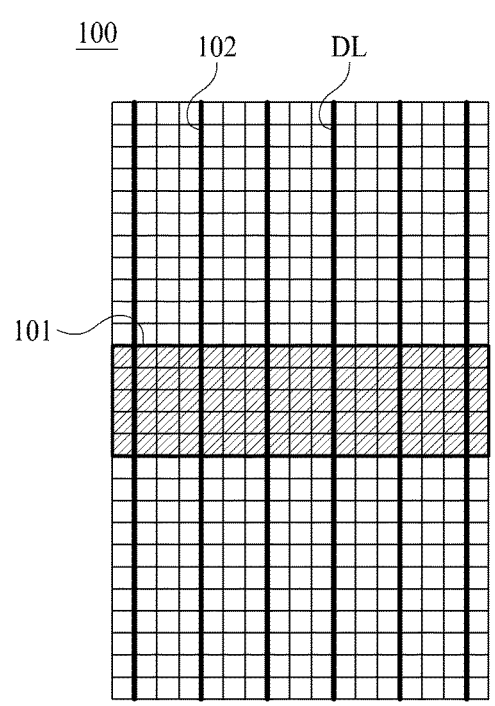

FIGS. 8 to 12 are diagrams schematically illustrating example bending areas of the panel 100 of the flexible organic light emitting display device according to an embodiment of the present invention. In FIGS. 8 to 12, reference numeral 101 refers to a bending area where it is determined whether bending occurs. In FIG. 12, reference numeral 102 refers to a data line among data lines DL which is sensed for determining whether bending occurs.

Figure 8:
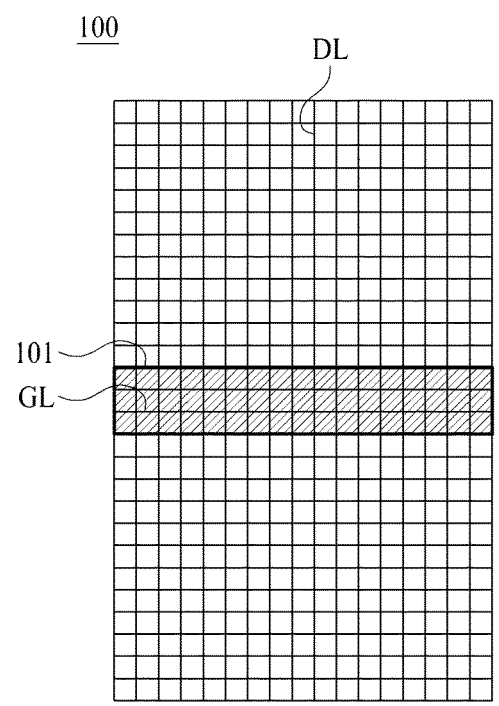
FIGS. 8 to 12 are diagrams schematically illustrating a plane of a panel applied to a flexible organic light emitting display device according to an embodiment of the present invention.

First, in FIG. 8, the bending area 101 may be disposed in a middle portion of the panel 100. In this case, the controller 400 may determine whether the panel 100 is bent in a widthwise line direction (for example, a horizontal line direction) of the panel 100, based on the sensing data.

At least one gate line GL and at least one data line DL may be provided in the bending area 101. For example, four gate lines and eighteen data lines may be provided in the bending area 101 illustrated in FIG. 8.

In the auxiliary sensing period, the gate driver 200 may sequentially supply the gate pulse GP and the sensing pulse SP to four gate lines GL and a sensing pulse line SPL provided in the bending area 101 according to the sensing gate control signal GCS_S. In this case, the data driver 300 may supply a sensing data voltage to each of eighteen data lines provided in the bending area 101 and may receive sensing signals through eighteen sensing lines SL.

Figure 9:
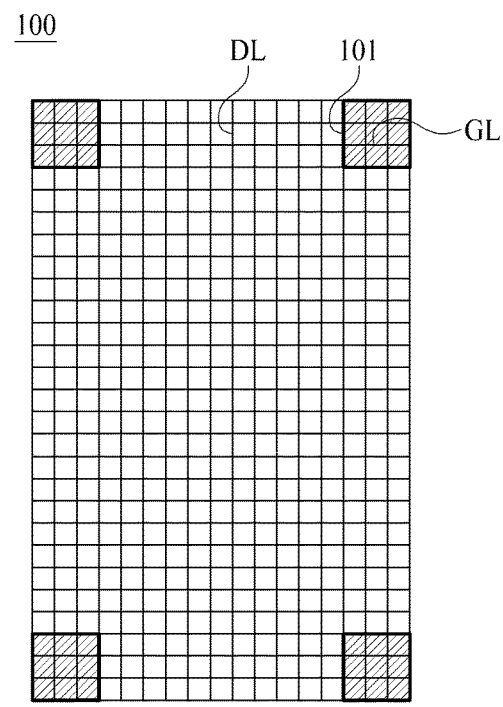

Second, in FIG. 9, the bending area 101 may be disposed in each of four corners of the panel 100. In this case, the controller 400 may determine whether each of the four corners of the panel 100 is bent, and may determine a three-dimensional form of the panel 100. Four gate lines and four data lines may be provided in each of a plurality of the bending areas 101 illustrated in FIG. 9.

In the auxiliary sensing period, the gate driver 200 may sequentially supply the gate pulse GP and the sensing pulse SP to four gate lines GL and sensing pulse lines SPL provided in an upper end of the panel 100. In this case, the data driver 300 may supply a sensing data voltage to each of data lines provided in the bending areas 101 disposed in the upper end and may receive sensing signals through sensing lines SL provided in the bending areas 101.

In the auxiliary sensing period, a sensing operation may be performed on the bending areas 101 disposed in the upper end, and then, the gate driver 200 may sequentially supply the gate pulse GP and the sensing pulse SP to four gate lines GL and sensing pulse lines SPL provided in a lower end of the panel 100. In this case, the data driver 300 may supply a sensing data voltage to each of data lines provided in the bending areas 101 disposed in the lower end and may receive sensing signals through sensing lines SL provided in the bending areas 101.

Third, in FIG. 10, the bending areas 101 may be respectively disposed in a middle portion of the upper end, a middle portion of the lower end, a middle portion of a left side, and a middle portion of a right side of the panel 100. In this case, the controller 400 may determine whether the panel 100 is bent in the widthwise line direction (for example, the horizontal line direction) of the panel 100, determine whether the panel 100 is bent in a height line direction (for example, a vertical line direction) of the panel 100, and determine a three-dimensional form of the panel 100. Four gate lines and four data lines may be provided in each of the bending areas 101 illustrated in FIG. 10.

The gate driver 200, as described above with reference to FIG. 9, may sequentially supply the gate pulse PS and the sensing pulse SP to gate lines GL and sensing pulse lines SPL provided in the upper end, a middle portion, and the lower end of the panel 100. In this case, when the gate pulse or the sensing pulse is supplied to a gate line provided in the bending area 101, the driver 300 may receive sensing signals through sensing lines SL provided in the bending area 101.

Fourth, in FIG. 11, the bending areas 101 may be respectively disposed in the middle portion of the upper end, the middle portion of the lower end, the middle portion of the left side, the middle portion of the right side, and each of four corners of the panel 100. In this case, the controller 400 may determine whether the panel 100 is bent in the widthwise line direction (for example, the horizontal line direction) of the panel 100, determine whether the panel 100 is bent in the height line direction (for example, the vertical line direction) of the panel 100, determine the three-dimensional form of the panel 100, and determine whether each of the four corners of the panel 100 is bent. Four gate lines and four data lines may be provided in each of the bending areas 101 illustrated in FIG. 11.

The gate driver 200, as described above with reference to FIGS. 9 and 10, may sequentially supply the gate pulse PS and the sensing pulse SP to gate lines GL and sensing pulse lines SPL provided in the upper end, the middle portion, and the lower end of the panel 100. In this case, when the gate pulse or the sensing pulse is supplied to the gate line provided in the bending area 101, the driver 300 may receive the sensing signals through the sensing lines SL provided in the bending area 101.

Fifth, as in the panel illustrated in FIG. 8, the bending area 101 may be disposed in the middle portion of the panel 100 in FIG. 12. In this case, in the panel illustrated in FIG. 8, all data lines DL and sensing lines SL provided in the bending area 101 may be driven, and in the panel illustrated in FIG. 12, some of all data lines DL and sensing lines SL provided in the bending area 101 may be driven.

Furthermore, when pieces of sensing data are generated by driving all data lines and sensing lines provided in the bending area 101, a period for sensing may be long, and a capacity of the storage unit 450 storing the pieces of sensing data may be large. In order to solve such a problem, according to the present embodiment, as illustrated in FIG. 12, less than all data lines and sensing lines provided in the bending area 101 may be driven. In comparison with a case where sensing is performed in a method illustrated in FIG. 8, when sensing is performed in a method illustrated in FIG. 12, the number of operations is reduced, a sensing duration is shortened, and sensing may be performed on a relatively wider bending area. In this case, the data lines and the sensing lines which are driven by the driver 300 in the auxiliary sensing period may be set to be arranged at certain intervals at every auxiliary sensing period.

As another example, the data lines and the sensing lines which are driven by the driver 300 in the auxiliary sensing period may be randomly changed at every auxiliary sensing period. In this case, pieces of sensing data in the bending area may be collected through sensing lines which are randomly selected, and thus, even when a specific pixel is deteriorated or is defective, whether the panel 100 is bent or a degree to which the panel 100 is bent may be determined stably. Moreover, less that all gate lines provided in the bending area 100 may be driven.

Information about the bending or bending degree of the panel 100 generated by the controller 400 through the above-described operation may be transferred to an external system. The external system may execute various applications, based on the information.

Provided the example bending areas illustrated in FIGS. 8 to 12, the calculator 410 within the controller 400 may calculate a sum or an average of pieces of sensing data transferred from all pixels provided in the bending area 101 in a current frame K, or may divide all pixels into a plurality of bending areas 101 and may calculate a sum or an average of pieces of sensing data transferred from the plurality of bending areas 101. Alternatively, the calculator 410 may calculate a sum or an average of pieces of sensing data transferred from some pixels selected through sampling. Subsequently, the calculator 410 may compare a calculated value with a value calculated from a previous frame K−1 to determine whether there is a change or a degree of the change. The calculator 410 may determine whether the bending area is bent or a degree to which the bending area is bent, based on a result of the determination.

When an arithmetic operation is performed on only previous frame data, the controller 400 may malfunction despite a small change. In order to prevent such an occurrence, the controller 400 may obtain a stable output value by using an infinite impulse response (IIR) filter for frame data.

Figure 13:
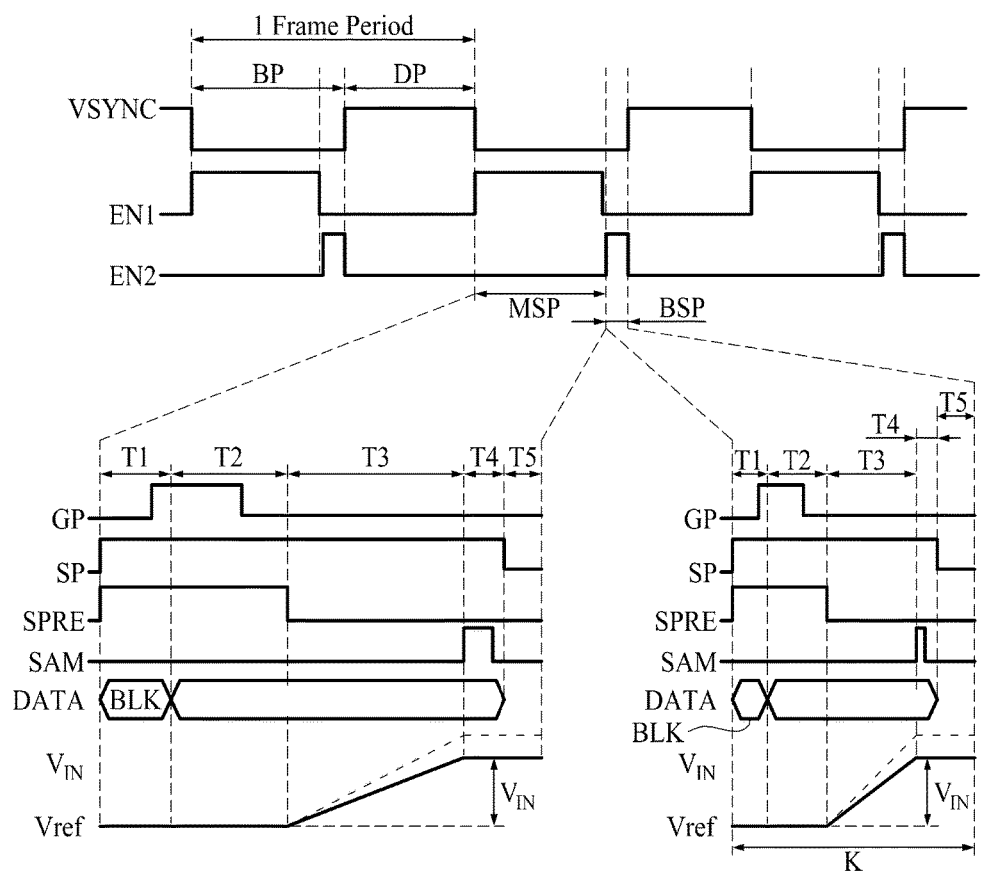
FIG. 13 is a diagram showing waveforms of signals applied to driving of a flexible organic light emitting display device according to an embodiment of the present invention.
Figure 14:
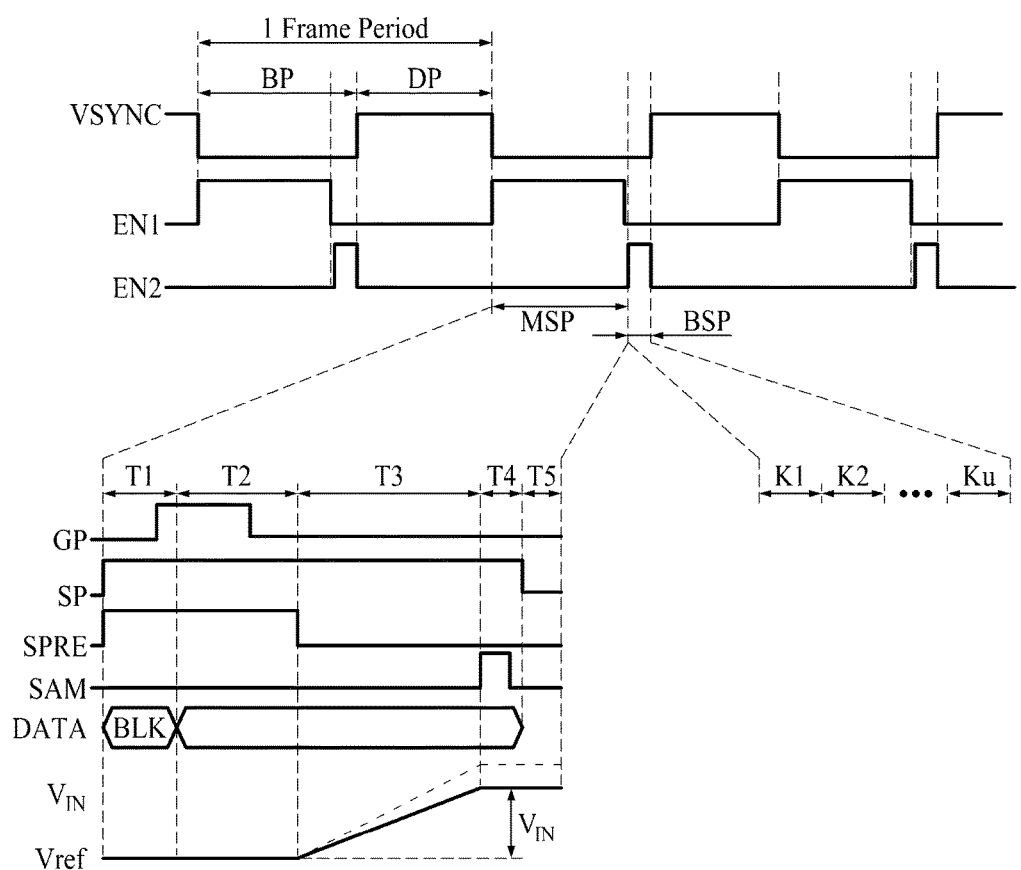
FIG. 14 is another diagram showing waveforms of signals applied to driving of a flexible organic light emitting display device according to an embodiment of the present invention.

FIG. 13 is a diagram showing waveforms of signals applied to driving of the flexible organic light emitting display device according to an embodiment of the present invention, and FIG. 14 is another diagram showing waveforms of signals applied to driving of the flexible organic light emitting display device according to an embodiment of the present invention.

As described above, one frame period may include a display period DP where an image is displayed and a blank period BP. The display period DP and the blank period BP may be distinguished by a vertical synchronization signal VSYNC generated by the controller 400.

According to an embodiment of the present invention, the blank period (a vertical blank period) may be temporally divided, and a sensing operation of compensating for characteristic of a driving transistor and a sensing operation of determining whether bending occurs may be performed. For example, in the embodiment of the present invention, the sensing operation of compensating for the characteristic of the driving transistor may be performed in a main sensing period MSP where a first enable signal EN1 is enabled.

In the embodiment of the present invention, by using the structures described above with reference to FIGS. 2 to 12, the sensing operation of determining whether bending occurs may be performed in an auxiliary sensing period BSP where a second enable signal EN2 is enabled. Pieces of sensing data collected through sensing may be stored in the storage unit 450. An arithmetic operation may be performed on stored values by a column unit, and whether the driving transistor Tdr extends or shrinks or a degree to which the driving transistor Tdr extends or shrinks may be determined by comparing a value of a previous frame with a value of a current frame.

To this end, as described above, the flexible organic light emitting display device according to an embodiment of the present invention may include the panel 100, the data driver 300, the gate driver 200, the sensing unit 320, and the controller 400. The sensing unit 320 may sense bending of the panel 100 in the blank period BP of one frame period by using the pixel driving circuit PDC which is included in each of the plurality of pixels 110, for sensing a characteristic change of the driving transistor Tdr driving the organic light emitting diode included in each of the pixels 110. The controller 400 may sense the characteristic change of the driving transistor Tdr, based on pieces of sensing data transferred from the sensing unit 320 and may analyze whether the panel 100 is bent, based on the pieces of sensing data. In this case, the sensing data Sdata used to analyze whether the panel 100 is bent may be changed based on a degree to which the driving transistor Tdr included in the pixel driving circuit PCD extends or shrinks, and whether the panel 100 is bent or a degree to which the panel 100 is bent may be determined based on a characteristic of the driving transistor Tdr.

To this end, in the main sensing period MSP of the blank period BP, the sensing unit 320 may drive first pixel driving circuits included in pixels connected to a first gate line to perform a sensing operation of sensing the characteristic changes of driving transistors included in the first pixel driving circuits. Here, the first gate line may denote a gate line, for which sensing is performed for sensing the characteristic changes, among the gate lines included in the panel 100. The first pixel driving circuits may denote pixel driving circuits, which are connected to the first gate line and for which sensing is performed for sensing the characteristic changes, among a plurality of pixel driving circuits included in the panel 100.

In the main sensing period MSP, one first gate line may be selected, and the characteristic changes of driving transistors included in pixels connected to the one first gate line may be sensed.

First, as shown in FIG. 14, in a first period T1 of the main sensing period MSP, the gate pulse GP may have a low level, the sensing pulse SP may have a high level, a second switching signal SPRE for controlling a second switch 323 included in the sensing unit 320 illustrated in FIG. 3 may have a high level, a first switching signal SAM for controlling a first switch 322 included in the sensing unit 320 illustrated in FIG. 3 may have a low level, and black data BLK may be supplied to a corresponding data line. Here, the first switch 322 may connect the an analog-to-digital converter (ADC) 321 to a corresponding sensing line SL, and the second switch 323 may transfer a reference voltage Vref supplied through the corresponding sensing line SL. Sensing data Sdata, which is a digital value obtained through conversion by the ADC 321, may be transferred to the controller 400. In the first period T1, a voltage Vin applied to a capacitor connected to the corresponding sensing line SL illustrated in FIG. 3 may be the reference voltage Vref.

In a second period T2 of the main sensing period MSP, the gate pulse GP may have a high level, the sensing pulse SP may have a high level, the second switching signal SPRE may have a high level, the first switching signal SAM may have a low level, and a specific data voltage for sensing may be supplied to a corresponding data line. In the second period T2, the voltage Vin applied to the capacitor Cin connected to the corresponding sensing line SL illustrated in FIG. 3 may be the reference voltage Vref.

In a third period T3 of the main sensing period MSP, the gate pulse GP may have a low level, the sensing pulse SP may have a high level, the second switching signal SPRE may have a low level, the first switching signal SAM may have a low level, and the specific data voltage for sensing may be supplied to the corresponding data line. In the third period T3, the voltage Vin applied to the capacitor Cin connected to the corresponding sensing line SL illustrated in FIG. 3 may progressively increase.

In a fourth period T4 of the main sensing period MSP, the gate pulse GP may have a low level, the sensing pulse SP may have a high level, the second switching signal SPRE may have a low level, the first switching signal SAM may have a high level, and the specific data voltage for sensing may be supplied to the corresponding data line. In the fourth period T4, the voltage Vin applied to the capacitor Cin connected to the corresponding sensing line SL illustrated in FIG. 3 may have a specific value, based on the characteristic of the driving transistor Tdr.

In a fifth period T5 of the main sensing period MSP, the gate pulse GP may have a low level, the sensing pulse SP may have a low level, the second switching signal SPRE may have a low level, and the first switching signal SAM may have a low level. In the fifth period T5, the voltage Vin applied to the capacitor Cin connected to the corresponding sensing line SL illustrated in FIG. 3 may have the specific value, based on the characteristic of the driving transistor Tdr.

The controller 400 may analyze the sensing data, in which the specific value is reflected, to sense the characteristic change of the driving transistor Tdr. The characteristic change of the driving transistor Tdr may include a variation in mobility or a variation in a threshold voltage. For example, the data current Idata in FIG. 3 may be expressed as Equation (1), and the voltage Vin applied to the capacitor connected to the corresponding sensing line SL may be expressed as Idata×T3/Cin, namely, Vin=Idata×T3/Cin.

In this case, the voltage Vin applied to the corresponding sensing line SL by the pixel driving circuit PDC may include a variation caused by mobility "u" and a threshold voltage "Vth". That is, when the mobility "u" or the threshold voltage "Vth" of the driving transistor Tdr varies, the data current Idata or the voltage Vin applied to the corresponding sensing line SL may vary. The controller 400 may measure a variation rate of the data current Idata or the voltage Vin to determine a variation rate of the mobility "u" or the threshold voltage "Vth" of the driving transistor Tdr.

In the auxiliary sensing BSP of the blank period BP, the sensing unit 320 may drive at least one second pixel driving circuit included in each of pixels connected to a second gate line provided in bending area 101 to sense bending of the bending area 101. Here, the second gate line may denote a gate line, which is provided in the bending area 101 and for which sensing is performed for sensing the bending of the bending area 101, among the gate lines included in the panel 100. The at least one second pixel driving circuit may denote a pixel driving circuit, which is connected to the second gate line and for which sensing is performed for sensing the bending of the bending area 101, among the plurality of pixel driving circuits included in the panel 100.

A driving method in periods T1 to T5 of the auxiliary sensing period BSP may be the same as the above-described driving method in the first to fifth periods T1 to T5 of the main sensing period MSP. Therefore, the controller 400 may measure a variation rate of the data current Idata or the voltage Vin to determine whether the bending area 101 is bent or a degree to which the bending area 101 is bent.

In this case, FIG. 13 shows a waveform diagram when pieces of sensing data respectively corresponding to pixels connected to one gate line are obtained in the auxiliary sensing period BSP. FIG. 14 shows a waveform diagram when pieces of sensing data respectively corresponding to pixels connected to u number of gate lines are obtained in the auxiliary sensing period BSP.

If the number of gate lines provided in the bending area 101 is not large, for example, if two gate lines are provided in the bending area 101, pieces of sensing data may be collected from pixels connected to one gate line at every auxiliary sensing period BSP. Since pieces of sensing data corresponding to two gate lines should be collected, a primary sensing operation may be performed on the bending area 101 after two frame periods elapse. Subsequently, during two frame periods, pieces of sensing data corresponding to two gate lines may be again collected, and thus, a secondary sensing operation may be performed on the bending area 101. The controller 400 may compare the pieces of sensing data collected through the primary sensing operation with the pieces of sensing data collected through the secondary sensing operation to determine whether the bending area 101 is bent or a degree to which the bending area 101 is bent.

When the number of gate lines provided in the bending area 101 is large, when sensing is performed on one gate line in the auxiliary sensing period BSP, the primary sensing operation and the secondary sensing operation may be performed after tens of frames or hundreds of frames elapse. In this case, a sensing period for determining whether the bending area 101 is bent or a degree to which the bending area 101 is bent is too long.

In order to solve such a problem, according to the present embodiment, as shown in FIG. 14, the auxiliary sensing period BSP may be divided into at least two sub auxiliary sensing periods K1 to Ku. In each of the sub auxiliary sensing periods K, the driving method in the auxiliary sensing period BSP described above with reference to FIG. 13 may be performed identically.

Furthermore, according to the present embodiment, a sensing operation of determining whether bending occurs may be performed on all gate lines provided in the bending area 101 in one auxiliary sensing period BSP. To this end, in the auxiliary sensing period BSP, the gate driver 200 may sequentially drive two or more the second gate lines provided in the bending area 101. In this case, the sensing unit 320 may sequentially drive the second pixel driving circuits, connected to the two or more second gate lines which are sequentially driven, to sense bending of the bending area 101.

In order to perform the above-described function, the controller 400 may generate the normal gate control signal GCS to transfer the normal gate control signal GCS to the gate driver 200 in the display period DP, and in the auxiliary sensing period BSP, the controller 400 may generate the sensing gate control signal GCS_S to transfer the sensing gate control signal GCS_S to the gate driver 200. The gate driver 200 may output gate pulses, having a frequency higher than frequencies of gate pulses which are output to the second gate lines in the display period DP, to the second gate lines by using the sensing gate control signal GCS_S. In the auxiliary sensing period BSP, the sensing unit 320 may supply the reference voltage to the second pixel driving circuit according to the second switching signal SPRE and may convert an analog signal, received from the second pixel driving circuit, into digital sensing data to transfer the digital sensing data to the controller 400 according to the first switching signal SAM.

According to the above-described embodiments of the present invention, whether the panel 100 is bent or a degree to which the panel 100 is bent may be determined by using the pixel driving circuits PDC which are provided for sensing characteristic changes of the driving transistors included in the panel 100.

Example methods associated with the structures described above with reference to FIGS. 2 to 12 are described. An example method may be performed during the auxiliary sensing period BSP. As mentioned above, the auxiliary sensing period BSP may be divided into at least two sub auxiliary sensing periods K1 to Ku. An example method may be performed during sub auxiliary sensing periods. The methods may involve analyzing the sensing data in each frame or in the predetermined frame to determine whether the voltage or the current increases or decreases, and thus determine whether an area where the driving transistor Tdr is provided extends, shrinks, or tilts. Provided the results of the analysis, the methods may include determining whether the bending area where the driving transistor Tdr is provided is bent or a degree to which the bending area is bent.

In a main sensing period, the data driver 310 may output data voltages, used to sense mobility or a threshold voltage for calculating a display compensation value, to the data lines DL1 to DLd according to the data control signal DCS. In the main sensing period, the sensing unit 320 may drive first pixel driving circuits included in pixels connected to a first gate line to perform a sensing operation of sensing the characteristic changes of driving transistors included in the first pixel driving circuits.

Figure 15:
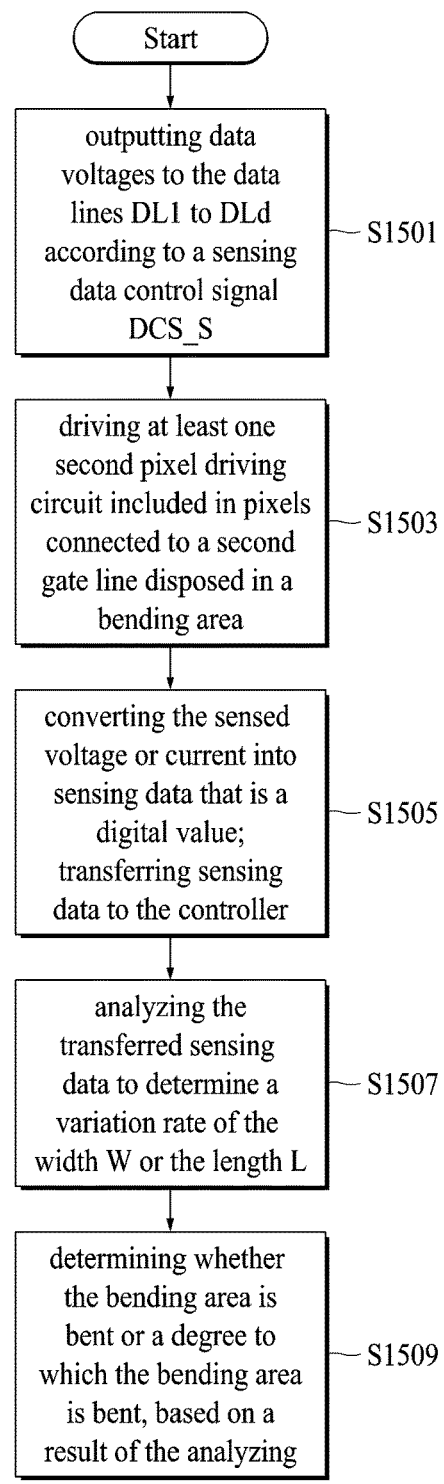
FIG. 15 is a flowchart for a method according to an embodiment of the present invention.

FIG. 15 is a flowchart for a method of determining whether the panel is bent or a degree to which the panel is bent according to an embodiment of the present invention. The method may include outputting, step S1501, by the data driver 310 during an auxiliary sensing period, data voltages to the data lines DL1 to DLd according to a sensing data control signal DCS_S among the data control signals. The method may include driving, step S1503, at least one second pixel driving circuit, by the sensing unit 320, included in pixels connected to a second gate line, to sense characteristic changes in the driving transistor Tdr.

The method may include converting, step S1505, by the sensing unit 320, a sensed voltage or current, received from the pixel driving circuit PDC, into sensing data that is a digital value, and may include transferring the sensing data to the controller 400.

The method may include analyzing, step S1507, by the controller 400, the sensing data transferred from the sensing unit 320 to determine a variation rate of the width W or the length L of the driving transistor Tdr, and may include determining, step S1509, whether the bending area where the driving transistor Tdr is provided is bent or a degree to which the bending area is bent, based on a result of the analyzing.

In example methods, the calculator 410 within the controller 400 may calculate a sum or an average of pieces of sensing data transferred from all pixels provided in the bending area 101 in a current frame K, or may divide all pixels into a plurality of bending areas 101 and may calculate a sum or an average of pieces of sensing data transferred from the plurality of bending areas 101. Alternatively, the calculator 410 may calculate a sum or an average of pieces of sensing data transferred from less than all pixels selected through sampling. Subsequently, the calculator 410 may compare a calculated value with a value calculated from a previous frame K−1 to determine whether there is a change or a degree of the change. The calculator 410 may determine whether the bending area is bent or a degree to which the bending area is bent, based on a result of the comparison.

Therefore, according to the embodiments of the present invention, a bending sensor for determining whether the panel 100 is bent or a degree to which the panel 100 is bent is not needed. Therefore, the manufacturing cost of the flexible organic light emitting display device is reduced, and a manufacturing process is simplified.

As described above, according to the embodiments of the present invention, although a separate bending sensor is not provided, whether the panel is bent is accurately determined. Moreover, according to the embodiments of the present invention, since a deformation degree of the flexible organic light emitting display device is sensed in real time, various applications associated with the presence of bending are simply executed.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A flexible organic light emitting display device comprising:
    a panel including a plurality of data lines, a plurality of gate lines and a plurality of pixels;
    a data driver configured to drive the plurality of data lines;
    a gate driver configured to drive the plurality of gate lines;
    a sensing unit configured to sense bending of the panel in a blank period of one frame period by using a pixel driving circuit included in each of the plurality of pixels, for sensing a characteristic change of a driving transistor driving an organic light emitting diode included in each of the plurality of pixels, the one frame period including the blank period and a display period; and
    a controller configured to determine the characteristic change of the driving transistor or analyze whether the panel is bent, based on pieces of sensing data transferred from the sensing unit,
    wherein in a main sensing period of the blank period, the sensing unit drives first pixel driving circuits respectively included in pixels connected to a first gate line to perform a sensing operation of sensing characteristic changes of driving transistors respectively included in the first pixel driving circuits, and
    wherein in an auxiliary sensing period of the blank period, the sensing unit drives at least one second pixel driving circuit respectively included in pixels connected to a second gate line disposed in a bending area to determine whether the bending area is bent.

2. The flexible organic light emitting display device of claim 1, wherein the pieces of sensing data, used to analyze whether the panel is bent, vary according to a degree to which the driving transistor included in the pixel driving circuit extends or shrinks.

3. The flexible organic light emitting display device of claim 1, wherein in the auxiliary sensing period, the gate driver sequentially drives two or more of the second gate lines provided in the bending area, and the sensing unit sequentially drives the second pixel driving circuits, connected to the two or more of the second gate lines which are sequentially driven, to determine whether the bending area is bent.

4. The flexible organic light emitting display device of claim 3, wherein the controller generates a normal gate control signal to transfer the normal gate control signal to the gate driver in the display period, and in the auxiliary sensing period, generates a sensing gate control signal to transfer the sensing gate control signal to the gate driver, and
    wherein the gate driver outputs a gate pulse, having a frequency higher than a frequency of a gate pulse which is output to the second gate line in the display period, to the second gate line by using the sensing gate control signal.

5. The flexible organic light emitting display device of claim 3, wherein in the auxiliary sensing period, the sensing unit supplies a reference voltage to the second pixel driving circuit according to a second switching signal and converts an analog signal, received from the second pixel driving circuit, into digital sensing data to transfer the digital sensing data to the controller according to a first switching signal.

6. The flexible organic light emitting display device of claim 2, wherein the degree to which the driving transistor extends or shrinks is indicated by the characteristic change of the driving transistor.

7. A flexible organic light emitting display device comprising:
    a panel including a plurality of data lines, a plurality of gate lines, a plurality of pixels, and a bending area, each of the plurality of pixels having a pixel driving circuit, a sensing pulse line and a sensing line;
    a gate driver configured to supply a gate pulse and a sensing pulse to the plurality of gate lines and the sensing pulse lines, respectively, provided in the bending area;
    a data driver configured to supply a sensing data voltage to the plurality of data lines provided in the bending area;
    a driving transistor, included in a pixel driving circuit connected to a gate line of the plurality of gate lines, driven by a sensing unit to obtain sensing signals in the sensing line related to the bending area; and
    a controller configured to analyze the sensing signals to determine a variation rate of a width or length of the driving transistor and determine whether the bending area is bent or a degree to which the bending area is bent,
    wherein less than all data lines and sensing lines provided in the bending area are driven during an auxiliary sensing period.

8. The flexible organic light emitting display device of claim 7, wherein the sensing unit is configured to convert the sensing signals into sensing data and transfer the sensing data to the controller.

9. A method of determining bending or a degree of bending in a display panel of a flexible organic light emitting device, the display panel including a plurality of pixels, a plurality of data lines, a plurality of gate lines, each pixel including a pixel driving circuit having a driving transistor, the flexible organic light emitting device including a sensing unit and a controller, the method comprising:
    supplying data voltages to the plurality of data lines according to a sensing data control signal;
    driving at least one pixel driving circuit via a gate line and a sensing line disposed in a bending area of the display panel to obtain a sensed voltage or current;
    converting, by the sensing unit, the sensed voltage or current into sensing data; and
    transferring, by the sensing unit, the sensing data to the controller;
    analyzing, by the controller, the sensing data to determine a variation rate of a width or length of the driving transistor; and
    determining, by the controller, whether the bending area is bent or a degree to which the bending area is bent, based on a result of the analyzing,
    wherein the supplying, driving, converting, transferring, analyzing and determining are performed during an auxiliary sensing period of a blank period, and
    wherein the analyzing includes calculating a sum or an average of pieces of sensing data transferred from all pixels provided in the bending area, and comparing the calculated value with a value calculated from a previous frame K−1 to determine whether there is a change.

10. The method according to claim 9, wherein the auxiliary sensing period is divided into at least two sub auxiliary sensing periods, and wherein the supplying, driving, analyzing and determining are performed during the sub auxiliary sensing periods.

11. The method according to claim 9, wherein the analyzing includes dividing all pixels into a plurality of bending areas, calculating a sum or average of pieces of sensing data transferred from the plurality of bending areas, and comparing the calculated value with a value calculated from a previous frame K−1 to determine whether there is a change.

12. The method according to claim 9, wherein the analyzing includes calculating a sum or an average of pieces of sensing data transferred from some pixels selected through sampling, and comparing the calculated value with a value calculated from a previous frame K−1 to determine whether there is a change.

* * * * *